United States Patent [19]

Tonello et al.

[11] Patent Number: 5,416,805
[45] Date of Patent: May 16, 1995

[54] RECEIVER FOR RECEIVING FREQUENCY MODULATED SIGNALS AND HAVING A CONTROLLED ACQUISITION BAND

[75] Inventors: Emile Tonello, Toulouse; Christian Herbere, Plaisance du Touch, both of France

[73] Assignee: Alcatel Espace, Courbevoie, France

[21] Appl. No.: 846,056

[22] Filed: Mar. 5, 1992

[30] Foreign Application Priority Data

Mar. 8, 1991 [FR] France .................. 91 02816

[51] Int. Cl.⁶ .................................... H04L 27/06
[52] U.S. Cl. ......................... 375/344; 375/327;
375/373; 455/192.2
[58] Field of Search .............. 375/97, 81, 121, 120,
375/119, 98; 455/192.2, 192.1, 302

[56] References Cited

U.S. PATENT DOCUMENTS

| | | | |
|---|---|---|---|
| 4,556,988 | 12/1985 | Yoshisato | 455/182 |
| 4,910,467 | 3/1990 | Leitch | 375/98 |
| 5,060,297 | 10/1991 | Ma et al. | 455/302 |
| 5,115,208 | 5/1992 | Masdea et al. | 375/120 |

FOREIGN PATENT DOCUMENTS

| | | | |
|---|---|---|---|
| 0238141 | 9/1987 | European Pat. Off. | H03D 3/24 |
| 2079552 | 1/1982 | United Kingdom | H03L 7/08 |
| WO8810033 | 12/1988 | WIPO | H04B 1/30 |

*Primary Examiner*—Stephen Chin
*Assistant Examiner*—Hai H. Phan
*Attorney, Agent, or Firm*—Sughrue, Mion, Zinn, Macpeak & Seas

[57] ABSTRACT

A receiver for receiving frequency modulated signals and having a controlled acquisition band, the receiver including: a phase-locked loop (PLL) demodulator (40); a frequency translation circuit (30) including an intermediate frequency filter (36); a recentering loop (44) for recentering the signal received in the filter (36) when closed, and a decision circuit for closing the recentering circuit when a frequency to which the PLL is locked is sufficiently close to a desired frequency.

5 Claims, 2 Drawing Sheets

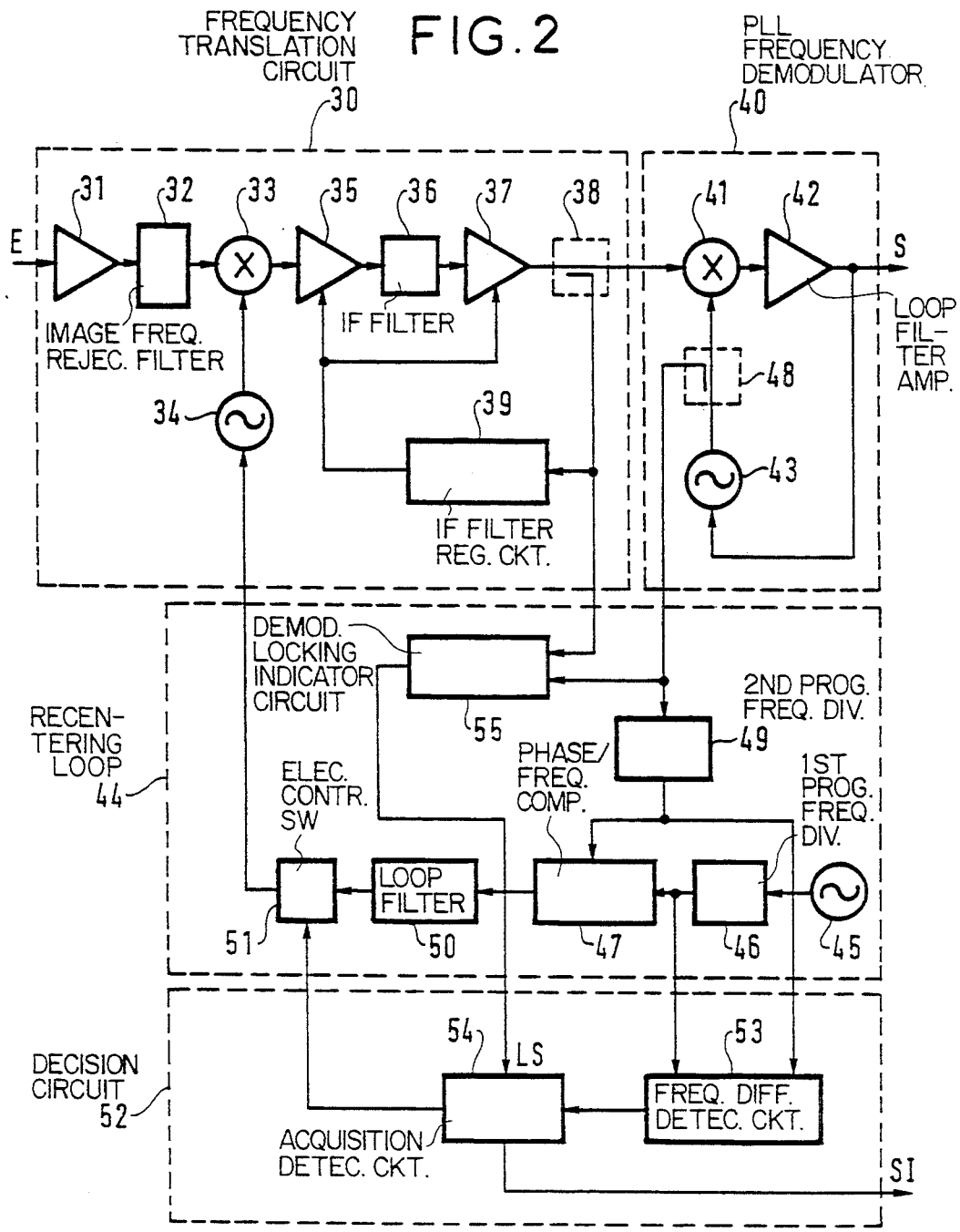

RECEIVER FOR RECEIVING FREQUENCY MODULATED SIGNALS AND HAVING A CONTROLLED ACQUISITION BAND

BACKGROUND OF THE INVENTION

Invention relates to a receiver for receiving frequency modulated signals and having a controlled acquisition band.

In certain phase-locked loop receivers, it must be possible for performance levels to be maintained in an environment having a very high level of jamming; i.e. with interference signals whose frequencies are very close to the frequency of the useful signal and whose power levels are very high (e.g. ±2.6 MHz with a jammer-to-signal ratio J/S≧50 dBp). For some of these receivers, it must be possible for such performance levels to be maintained in a space environment, and this poses problems linked to temperature and to ageing, etc.

Such performance levels are optimum when the signal which is applied to the demodulation circuit is almost perfectly centered in the intermediate frequency (IF) filter. It is therefore necessary to use a system which automatically recenters the received signal on the center frequency of the IF filter.

French Patent Application FR 2 596 220 describes a prior art frequency demodulator including a channel selection circuit, an intermediate frequency selection circuit, and an automatic frequency control circuit. That prior art frequency demodulator is described below with reference to FIG. 1.

Such a demodulator suffers from a certain number of drawbacks:
 it is protected from very high level jammers only by the quality of the intermediate frequency filter; and
 it includes three servo loops each of which requires passband adjustment.

U.K. Patent Application GB-A-2 079 552 describes a double phase lock loop system for receiving frequency modulated signals, which system includes a frequency translation circuit having an intermediate frequency filter and a decision circuit for deciding to close the phase-locked loop. The decision to close the phase-locked loop of the apparatus is taken solely on the basis of locking being detected.

Such a demodulator also suffers from insufficient protection against jamming, such protection being provided solely by the intermediate frequency filter. Furthermore, no provision is made prior to closing the phase-locked loop to discover the nature of the signal which has caused synchronization to be acquired, thereby allowing the loop to be closed indiscriminately on a jammer or on a signal as soon as locking is detected.

SUMMARY OF THE INVENTION

An object of the invention is to mitigate these drawbacks. To this end, the invention provides a receiver for receiving frequency modulated signals and having a controlled acquisition band, the receiver including a phase-locked loop demodulator and being characterized in that it further includes:
 a frequency translation circuit including an intermediate frequency filter; and
 a recentering loop for recentering the signal received in the filter.

Advantageously, the receiver further includes a decision circuit for deciding to close the recentering loop.

In an advantageous embodiment of the receiver of the invention, the frequency translation circuit comprises in succession between its input (which is the input of the receiver) and its output:
 an amplifier;
 an image frequency rejection filter;
 a mixer which receives a signal from a VCO (Voltage-Controlled Oscillator);
 a first controlled gain amplifier;
 an IF pass-band filter;
 a second controlled gain amplifier; and
 a coupler which is connected to an IF level regulating circuit which controls the two controlled gain amplifiers.

The phase-locked loop frequency demodulator comprises in succession:
 a mixer; and
 a loop filter amplifier whose output is the output of the receiver; an oscillator being connected between this output and an input of the mixer.

The recentering loop comprises in succession:
 a reference oscillator whose frequency is (IF/K) 1/K times the frequency (IF) of the IF filter.
 a first programmable frequency divider;
 a phase/frequency comparator which, at a second input, receives the signal from a coupler positioned at the output of the oscillator of the phase-locked loop frequency demodulator, via a second programmable frequency divider;
 a loop filter; and
 an electrically controlled switch whose output is connected to the VCO of the frequency translation circuit.

The decision circuit for deciding to close the recentering loop comprises a frequency difference detector circuit which, at its two inputs, receives the signals output by the two programmable frequency dividers, followed by an acquisition detector circuit which, at a second input, receives a signal from a demodulator locking indicator circuit whose inputs are connected to the two couplers; the acquisition detector circuit both controlling the switch, and also supplying a "receiver ready" indicator signal.

BRIEF DESCRIPTION OF THE DRAWINGS

The characteristics and advantages of the invention appear from the following description given by way of nonlimiting example with reference to the accompanying drawings, in which:
FIG. 2 shows a frequency modulated signal receiver of the invention.

DETAILED DESCRIPTION OF THE PREFERRED EMBODIMENTS

Figure 1:
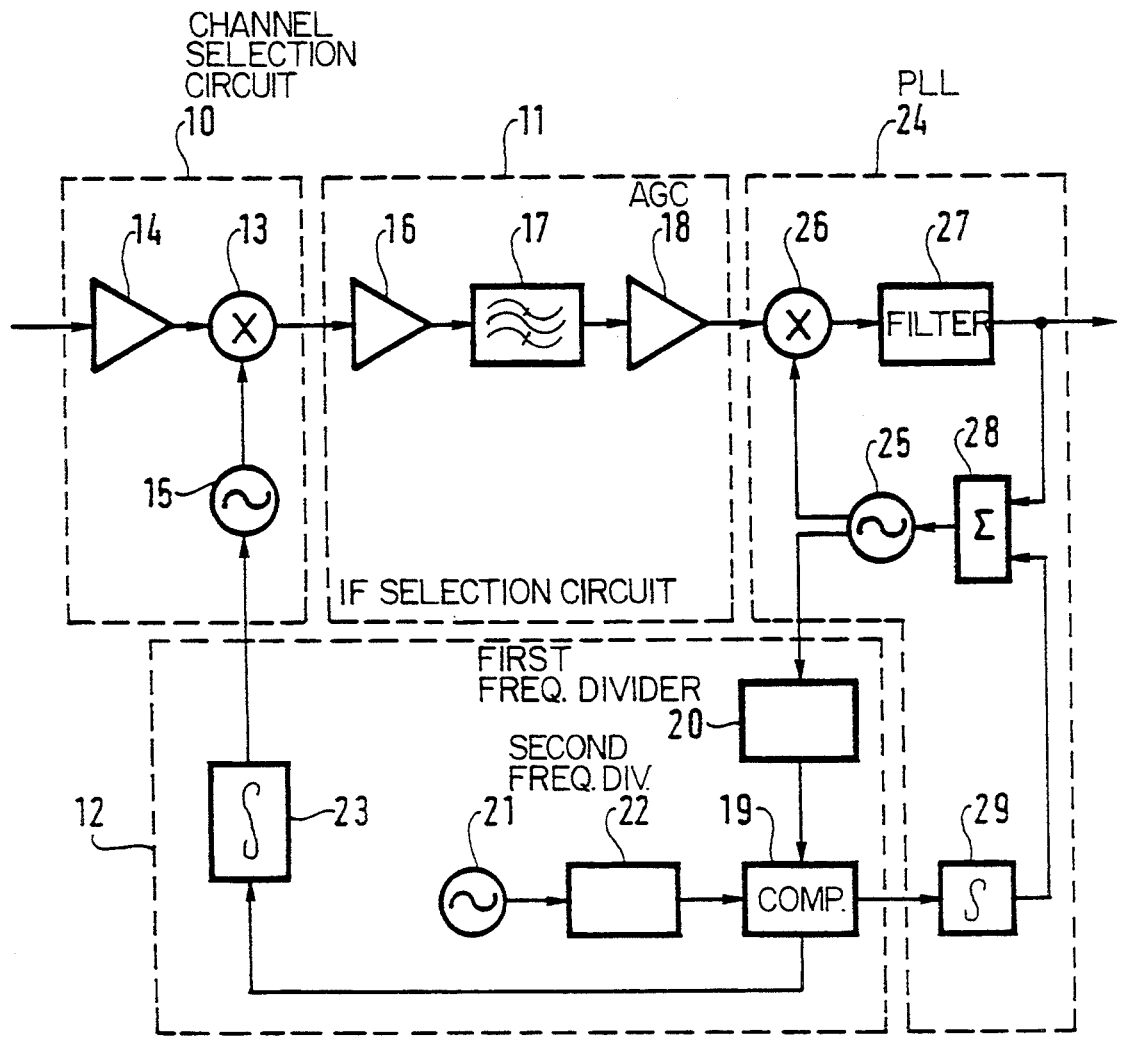
FIG. 1 shows a prior art frequency demodulator.

The prior art demodulator, as described in French Patent Application FR 2 596 220, includes a channel selection circuit 10, an intermediate frequency selection circuit 11, and an automatic frequency control circuit 12. The channel selection circuit 10 includes a mixer 13 whose inputs are respectively connected to an oscillator 15 and to an amplifier 14 receiving the frequency modulated signal at a determined carrier frequency. The intermediate frequency selection circuit 11 is composed of an amplifier 16, a band-pass filter 17, and an automatic controlled gain circuit 18, connected together in series. The automatic frequency control circuit 12 includes a comparator 19 receiving both the frequency signal to be compared, via a first frequency divider 20, and also a signal at a reference frequency, via a reference oscillator 21 and via a second frequency divider 22. The output of the comparator 19 is applied to an integrator 23 which generates the control voltage signal for the oscillator 15 of the channel selection circuit. At the output of the intermediate frequency selection circuit 11, the demodulator further includes a phase-locked loop 24 equipped with a voltage-controlled oscillator 25, a mixer 26 receiving both the output of the oscillator 25 and the output of the intermediate frequency selection circuit 11, and a loop filter 27. Upstream of its oscillator 25, the loop is further equipped with a control voltage correction circuit which comprises an adder 28 whose output is connected to the input of said oscillator 25 of the loop, and whose inputs are respectively connected to the output of the loop 24, which output is also the output (S) of the demodulator, and to the output of a correction voltage generator which comprises a second integrator 29 connected to the output of the comparator 19.

The demodulator operates as follows:
in the absence of a useful signal, the loop formed by the components referenced 25, 20, 19, 29 and 28 provides frequency stability for the oscillator 25 of the phase-locked loop demodulator; and
in the presence of a useful signal at the input of the receiver, the demodulator having the phase-locked loop 24 locks to the signal as translated and filtered by the mixer 26 and the oscillator 25. The loop formed by components 13, 16, 17, 18, 26, 25, 20, 19, 23, and 15 recenters the IF signal in the filter 17 by shifting the frequency of the oscillator 15.

The receiver of the invention, as shown in FIG. 2, comprises:
a frequency translation circuit 30 comprising in succession between its input, which is the input E of the receiver, and its output:
an amplifier 31;
an image frequency rejection filter 32;
a mixer 33 which receives a signal from a VCO (Voltage-Controlled Oscillator) 34;
a first controlled gain amplifier 35;
an IF band-pass filter 36;
a second controlled gain amplifier 37; and
a coupler 38 connected to an IF level regulating circuit 39 which controls the two controlled gain amplifiers and 37;
a phase-locked loop frequency demodulator 40 comprising in succession:
a mixer 41; and
a loop filter amplifier 42 whose output is the output S of the receiver; an oscillator 43 being connected between this output and a second input of the mixer 41;
a recentering loop 44 for recentering the signal received and translated in the IF filter, which recentering loop comprises in succession:
a reference oscillator 45 whose frequency (IF/K) is 1/K times the frequency of (IF) of the IF filter 36;
a first programmable frequency divider 46;
a frequency/phase comparator 47 which, at a second input, receives the signal from a coupler 48 positioned at the output of the oscillator 43 of the phase-locked loop frequency demodulator 40, via a second programmable frequency divider 49:
a loop filter 50; and
an electrically controlled switch 51 whose output is connected to the VCO of the translation circuit 30; and
a decision circuit 52 for taking a decision to close the recentering loop 44, which decision circuit comprises a frequency difference detector circuit 53 which, at its two inputs, receives the signals output by the two programmable frequency dividers 46 and 49, followed by an acquisition detector circuit 54 which, at a second input LS, receives a signal from a demodulator locking indicator circuit 55 whose inputs are connected to the two couplers 38 and 48; the acquisition detector circuit 54 both controlling the switch 51, and also supplying a "receiver ready" indicator signal SI.

The translation circuit 30 is used for translating, filtering and regulating the signal at the input of the frequency demodulator 40. The translation circuit 30 is such that in the absence of a signal at the input of the receiver, the noise level injected at the demodulator input 40 enables the frequency of the oscillator 43 to remain at the central frequency of the IF band-pass filter 36. Therefore, a servo loop is unnecessary.

The two programmable frequency dividers 46 and 49 are used for optimizing the compromise between modulation index and decision speed.

The phase/frequency comparator 47 is used as a detector by the recentering loop 44.

When open, the switch 51 forces a constant voltage on the oscillator 34, and on command from the circuit 53 it closes the recentering loop 44. The frequency difference circuit 53 makes it possible to evaluate the frequency difference between the frequency of the signal present at the input E of the receiver and the reference frequency of the signal supplied by the oscillator 45.

The above-described receiver of the invention operates as follows:
in the absence of a signal at the input E of the receiver, the noise level of the frequency translation circuit 30 at the input of the phase-locked loop demodulator 40 is such that the oscillator 43 of the demodulator 40 remains centered on the mean signal frequency, and therefore on the center frequency of the intermediate frequency filter 36; therefore, it is not necessary for the receiver to include a device for centering the oscillator 43; the circuit 55 does not supply the demodulator acquisition data and the decision circuit 52 does not close the recentering loop 44;
in the presence of a very high level jammer (e.g. 50 dB above the minimum reception level), the phase-locked loop demodulator 40 locks onto the jammer and the lock flag LS is set; the frequency difference detector 53 measures the value of the frequency difference; if the difference is greater than a reference value (which may be adjustable), then the decision circuit 52 does not close the recentering loop 44; the receiver therefore remains centered on its nominal reception frequency even in the presence of a very high level jammer; and
in the presence of a useful signal which has drifted (due to the Doppler effect, to component ageing or to temperature changes), the phase-locked loop demodulator 40 locks onto the IF signal; the lock flag LS is set; the frequency difference detector 53 causes the recentering loop 44 to close, thus acting on the VCO 34 to recenter the signal received and translated in the IF filter 36; the demodulation performance levels are therefore optimum regardless of the frequency variations of the input signal and therefore of the VCO 34.

It is necessary to use a receiver such as the above-described receiver when in an environment having a high level of jamming (e.g. with jammers a few MHz away having levels of 50 dB above the useful signal) where it is necessary to control the acquisition loop accurately. The uncertainty of the acquisition range may be of the order of a few percent.

Optimum setting of the division factors of the dividers 46 and 49 enables the compromise between modulation index and decision time to be adjusted.

By way of example, with a modulation index of about 1,500, the decision time is about 75 ms and the "receiver ready" indication time is about 1 second in the case of a useful signal at the edge of the acquisition band (800 kHz).

Naturally, the present invention is described and shown by way of preferred example only, and its component parts may be replaced by equivalent parts without going beyond the ambit of the invention.

In the event that the receiver is used in an environment having a lower level of jamming, the decision circuit 52 may be omitted. In which case the switch 51 is controlled by the locking indicator circuit 55. This simpler system centers the received signal just as effectively, but does not ensure that very high level jammers can be withstood. Nevertheless, electrically limiting the control voltage of the VCO 34 prevents the receiver from locking onto a jammer and from drifting too far away from the nominal reception frequency.

We claim:

1. A receiver for receiving frequency modulated (FM) signals and having a controlled acquisition band, said receiver comprising:
    a frequency translation circuit (30) including a frequency translating circuit for receiving said FM signals and translating them to produce a frequency translated signal having a desired frequency, said frequency translation circuit further including an intermediate frequency (IF) filter (36) receiving the frequency translated signal and providing an output signal and; a second controlled gain amplifier (37) for amplifying the output signal of the IF filter to produce a frequency translated output signal of said frequency translation circuit;
    a phase-locked loop (PLL) frequency demodulator (40) receiving at its input the frequency translated output signal from said frequency translation circuit and comprising a first local oscillator (43) in its phase loop, said PLL frequency demodulator providing a receiver output (S) and a first local oscillator output signal;
    a recentering loop (44) coupled to said frequency translation circuit and said PLL frequency demodulator and including: a recentering control signal circuit having a second local oscillator (45) which provides a reference frequency signal, said recentering control signal circuit receiving the first local oscillator output signal and comparing the first local oscillator output signal to the reference frequency signal to produce a frequency translation control signal; and a switch (51) responsive to a switch control signal for passing said frequency translation control signal to said frequency translation circuit to recenter the output of said IF filter;
    lock indicating means (55) for receiving the frequency translated output signal and the first local oscillator output signal, and for providing a first control signal (LS) when said first local oscillator output signal is locked to the frequency of the frequency translated output signal;
    frequency difference detection means (53) coupled to receive the first local oscillator output signal and the reference frequency signal, and for supplying a second control signal when a difference between the frequency of said first local oscillator output signal and the frequency of said reference frequency signal is smaller than a predetermined value; and
    acquisition detection means (54) coupled to receive said first and second control signals, and for supplying said switch control signal to said switch only when both of said first and second control signals are present.

2. A receiver according to claim 1, wherein the frequency translating circuit comprises:
    an amplifier (31) coupled to an input (E) of the receiver;
    an image frequency rejection filter (32) coupled to an output of said amplifier;
    a mixer (33) which receives a signal from a voltage controlled oscillator (VCO) (34) and which frequency translates an output of said image frequency rejection filter $E_1$;
    a first controlled gain amplifier (35) coupled to an output of said mixer for receiving and amplifying said mixer output to produce the frequency translated signal, and
    wherein said frequency translation circuit (3) further includes:
    a coupler (38) which is coupled to the frequency translated output signal and to an IF level regulating circuit (39) which controls the first and second controlled gain amplifiers (35 and 37).

3. A receiver according to claim 1, wherein the phase-locked loop frequency demodulator (40) comprises:
    a mixer (41) for receiving and mixing said frequency translated output signal and the first local oscillator output signal;
    a loop filter amplifier (42) whose input is coupled to an output of said mixer and whose output is the receiver output (S); and
    said first local oscillator (43) receiving the output of said loop filter amplifier.

4. A receiver according to claim 1, wherein said frequency translation circuit (30) further comprises a voltage-controlled oscillator (VCO) $E_2$ and wherein the recentering control signal circuit comprises:
    said second local oscillator (45) providing the reference frequency signal whose frequency (IF/K) is 1/K times the frequency (IF) of the IF filter (36);
    a first programmable frequency divider (46) receiving and frequency dividing the reference frequency signal;
    a phase/frequency comparator (47) having a first input connected to an output of the first programmable frequency divider and a second input connected to receive a signal derived from the first local oscillator output signal of the phase-locked loop frequency demodulator (40) via a second programmable frequency divider (49); and a loop filter (50) connected to receive and filter an output from said phase/frequency comparator to produce said frequency translation control signal;

and wherein said switch (51) receives as an input said frequency translation control signal and passes said frequency translation control signal to said voltage-controlled oscillator (VCO) of the frequency translation circuit (30) in accordance with said switch control signal.

5. A receiver according to claim 1, wherein said frequency translation circuit (30) further comprises a voltage-controlled oscillator (VCO) $E_3$ and wherein the recentering loop includes:

a first programmable frequency divider for receiving and frequency dividing the first local oscillator output signal from said PLL frequency demodulator; and a second programmable frequency divider for receiving and frequency dividing said reference frequency signal;

said frequency difference detection means comprising a frequency difference detector circuit (53) which, at its first and second inputs, receives signals output by the two programmable frequency dividers, said acquisition detection means comprising an acquisition detector circuit (54) which receives, at a first input the output from said frequency difference detector circuit (53) and, at a second input, receives said first control signal (LS), and provides as an output the switch control signal, said lock indicating means comprising a demodulator locking indicator circuit (55) coupled to receive the frequency translated output signal and the first local oscillator output signal and providing an output indicating when said PLL frequency demodulator is phase locked, wherein said output indicating when said PLL frequency demodulator is phase locked is the first control signal, said switch having its output connected to said voltage controlled oscillator in said frequency translation circuit, said voltage controlled oscillator in said frequency translation circuit providing its output to a mixer for frequency translating said frequency modulated signals to a frequency to be received by said IF filter, and said acquisition detection means also supplying a "receiver ready" indicator signal.

* * * * *